(12) United States Patent
Winkler

(10) Patent No.: US 7,414,203 B2
(45) Date of Patent: Aug. 19, 2008

(54) HOLDER FOR A COMPONENT SUPPORT

(75) Inventor: Uwe Winkler, Ettlingen (DE)

(73) Assignee: E.G.O. Elektro-Geraetebau GmbH (DE)

( * ) Notice: Subject to any disclaimer, the term of this patent is extended or adjusted under 35 U.S.C. 154(b) by 399 days.

(21) Appl. No.: 11/253,838

(22) Filed: Oct. 19, 2005

(65) Prior Publication Data

US 2006/0081753 A1    Apr. 20, 2006

(30) Foreign Application Priority Data

Oct. 20, 2004    (DE) .................... 10 2004 052 202

(51) Int. Cl.
*H01B 17/00* (2006.01)

(52) U.S. Cl. .................................. 174/138 G

(58) Field of Classification Search ................ 439/894; 174/138 D, 138 G; 248/615, 632, 633; 361/804, 361/770, 799, 758, 767

See application file for complete search history.

(56) References Cited

U.S. PATENT DOCUMENTS

| | | | | |
|---|---|---|---|---|
| 2,148,055 A | * | 2/1939 | Blumenthal | 248/615 |
| 2,914,275 A | * | 11/1959 | Mitchell | 248/633 |
| 2,935,280 A | * | 5/1960 | Symonds | 248/615 |
| 3,154,281 A | * | 10/1964 | Frank | 248/201 |
| 3,425,023 A | * | 1/1969 | Krol et al. | 439/571 |
| 4,102,522 A | * | 7/1978 | Munz | 248/615 |
| 4,130,327 A | | 12/1978 | Spaulding | |
| 4,588,854 A | * | 5/1986 | Bailey et al. | 174/535 |
| 4,619,431 A | | 10/1986 | Matsui et al. | |
| 4,781,488 A | * | 11/1988 | Hayashi | 403/408.1 |
| 5,137,248 A | | 8/1992 | Sato et al. | |
| 5,717,189 A | | 2/1998 | Goetz et al. | |
| 6,778,400 B2 | | 8/2004 | Kurle et al. | |

FOREIGN PATENT DOCUMENTS

| | | |
|---|---|---|
| DE | 203 16 002 U1 | 1/2004 |
| EP | 1 139 695 A2 | 10/2001 |
| GB | 2 151 833 A | 7/1985 |

* cited by examiner

*Primary Examiner*—Neil Abrams
(74) *Attorney, Agent, or Firm*—Akerman Senterfitt

(57) ABSTRACT

A holder is constructed for fixing printed circuit boards like for a contact switch unit of a glass ceramic hob between a cover and a substructure receiving the circuit boards. The holder has a plurality of elastic projections distributed integrally and in an area on one side of the holder and forming a surface spring. The holder can embrace or frame and consequently receive the circuit boards. The elastic projections (14) can be mounted against the substructure (72) and detent pins (54) on the other side of the holder can be fitted into holes in the supported components (74).

17 Claims, 2 Drawing Sheets

HOLDER FOR A COMPONENT SUPPORT

FIELD OF APPLICATION AND PRIOR ART

The invention relates to a holder for fixing at least one flat or areal component support.

One such arrangement is known from DE 44 19 866 A1. In the latter a control arrangement for an electric heating appliance is described and its control unit is to be housed in a housing applied to the underside of a glass ceramic plate. One part of said control unit is a sensor printed circuit board pressed by spring elements against the glass ceramic plate. This is necessary because the sensor printed circuit board can have widely varying contact switches. The spring elements also provide an electrical connection between the sensor circuit board and further component supports. For this purpose they can be constructed in SMD technology and on soldering are permanently contacted with the sensor circuit board and/or the other component support. It is disadvantageous that the arrangement is extremely inflexible. In the case of a defect it is necessary in a very complicated and time-intensive manner either to replace or disassemble and repair a complete subassembly. The increased installation costs also constitute a disadvantage. Moreover the application points of the forces produced by the springs are distributed non-uniformly over the sensor circuit board and an individual spring arrangement must be found for each sensor circuit board type.

PROBLEM AND SOLUTION

The problem of the invention is to provide a holder of the aforementioned type, which on the one hand can be universally used for different component supports and on the other provides a contact pressure which is uniformly distributed over the holder.

This problem is solved by a holder for fixing at least one component support between a cover and a substructure receiving the component support having a plurality of elastic projections distributed integrally and in an area on one side of said holder, wherein the projections form a surface spring over the area, and wherein the projections are hollow cup-shaped bodies having a free front end that can be applied to said substructure. Advantageous and preferred developments are explained in greater detail hereafter. By express reference the wording of the claims is made into part of the description.

According to the invention the holder has a plurality of elastic projections distributed in one piece and in areal manner on one side of the holder and which form a surface spring. The number of projections can vary between 1 and 500 preferably between 3 and 40. The holder preferably has an areal, slightly thick or even at least partly parallelepipedic construction, but is much wider and longer than it is high, i.e. it is substantially flat. The holder side over which the projections are distributed can be one of the narrow, circumferential sides of the holder, but can also be one of the two base sides. The projections fitted to one of the circumferential sides of the holder can be toroidal or tubular. The projections provided on the areal side of the holder can have a pointed, round, flat or any other conceivable geometry. The material from which the holder is made advantageously has at least partly springy characteristics.

In a development of the invention the projections are bodies, preferably hollow bodies. The area of the hollow body not engaging on a substrate and which forms a contact surface with the holder mainly constitutes the resilient element. The mechanical characteristics thereof can be very simply calculated and can therefore be designed in planned manner for specific requirements.

According to a further development of the invention the projections have a limited mutual spacing, which preferably roughly corresponds to the width of a projection. As a result of the small spacings the spring tension can be very uniformly distributed. Preferably the spacings between the different projections are largely identical.

In a further development of the invention the projections are cup-shaped, particularly truncated cone-shaped and they preferably have an elongated or substantially cylindrical end region on the smaller diameter end thereof. By means of the free front side the bodies can be applied to an areal substrate element of the substructure and preferably are connected to the areal holder at their larger diameter end. As a result of the truncated cone-shape of the projections a force acting on the cylindrical end region substantially perpendicular to the contact point with the substrate element is roughly uniformly distributed in the areal holder. The truncated cone-shaped design also facilitates manufacture, for example in an injection moulding process.

According to a further development of the invention at least one of the substantially cylindrical end regions on the truncated cone-shaped cup shape is elongated for fixing the holder. To this end the extended end region can be inserted in an opening in a flat part of the substructure, so that the holder can be fixed in its relative position with respect thereto. The holder can have a random number of extended or lengthened end regions and there are preferably between 2 and 4. For fixing the holder it is also possible to provide holes therein or clips on the outsides of the holder into which project lugs or pins of the substructure.

According to a development of the invention the projections are tubular. At at least two and preferably four of the circumferential holder edges they can pass into the areal holder.

According to a further development of the invention the holder has a plate-like main body and an edge at least partially surrounding said main body and projecting relative to the base surface of said main body in at least one extension direction. The extension direction is preferably oriented perpendicular to the base surface of the main body, so that the edge and the base form a trough-like shape for the insertion of a component support to be fixed. The trough-like shape is dimensioned in such a way that the component support to be fixed thereto is at least partly retained therein by clamps. As a result of the substantially perpendicular orientation of the edge relative to the base surface of the main body there is only a slight increase in the holder extension. It is conceivable for the edge to project in both extension directions perpendicularly relative to the base surface of the main body. Thus, on one side the edge can be used for increasing the contact pressure of the component support on a cover, in that the edge, in the same way as the cylindrical end region, is applied to an areal substrate element of the substructure.

According to a further development of the invention the edges can be partly or completely obviated. The component support can then be fixed to the main body in some other way, for example by adhesion. A height limitation of the spring travel or an increase in the contact pressure through the edge is then no longer required.

In another development of the invention the projections are oriented in a direction largely opposite to the extension direction of the edge surrounding the main body. Thus, the holder has two sides, each of which has a specific function. This significantly reduces the possibility of faulty procedure during installation or assembly.

According to a further development of the invention there is at least one pin with a detent on the holder. The pin preferably projects into the area surrounded by the edge and has a cylindrical shape. The pin secures the component support to be fixed in the holder against dropping out of the latter. For this purpose the component support has openings, which are preferably correspondingly constructed and have a slightly larger diameter than the pins. The detent on the pin is constructed in such a way that the flanks of the opening in the component support can be guided over the detent in a direction parallel to the longitudinal axis of the cylindrical pin. The movement of the component support is blocked by the detent in the opposite direction. On the pin can be provided a recess, for example for a screw. The recess is advantageously introduced from the side into the pin with which it engages on the holder. Advantageously the recess flanks have threads extending over the detent. If a component support is guided over the detents, it is possible to stiffen the pin with a screw and the detent can be brought up in the direction of the base body of the component support in order to in this way press the component support onto the base body.

In a further development of the invention the holder is made from an elastic material, which is preferably temperature-resistant, particularly up to 200 or 400øC. The elastic material makes it possible for the entire holder to be used as a spring element. The temperature resistance is necessary due to the use of the holder, for example in a glass ceramic hob. It must be ensured that the material from which the holder is made has largely constant material characteristics in the sought temperature range.

According to a further development of the invention the holder is made from a silicone elastomer. This material has the advantage that it can be used in an injection moulding process and has characteristics which are satisfactory in the range of use.

According to a further development of the invention the holder has a height up to 50 mm and said height is preferably between 6 and 18 mm. As a result of this limited height, the overall arrangement can be kept flat or shallow.

These and further features can be gathered from the claims, description and drawings and the individual features, both singly and in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

An exemplified embodiment of the invention is described in greater detail hereinafter relative to the diagrammatic drawings, wherein show.

DETAILED DESCRIPTION OF THE DRAWINGS

Figure 1:
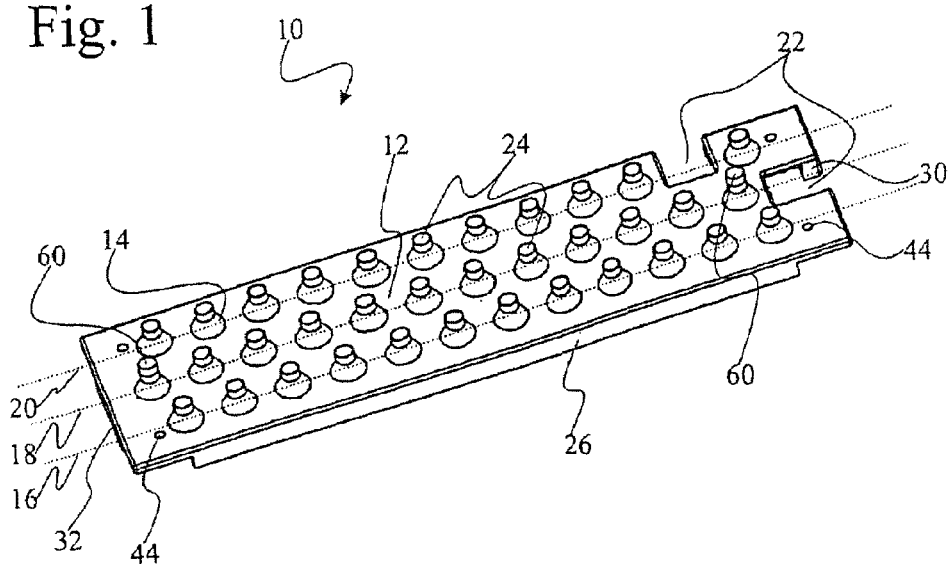
FIG. 1 An isometric view of the underside of a surface spring according to the invention.

FIG. 1 shows an inventive holder 10 on whose underside 12 are provided projections 14. The projections 14 form three largely parallel rows 16, 18, 20. Two recesses 22 are made in the rectangular base shape of the holder 10. If a not shown component support is placed in the holder, not shown connecting leads are passed through the recesses 22, for example for electrically connecting the components to the component support.

At their base on underside 12 the projections 14 are roughly as wide as they are high. With the front sides 24 of the projections 14 parallel to the underside 12, in the completely fitted state, the holder 10 engages on a not shown substrate, for example the base plate of an electrical appliance.

Figure 2:
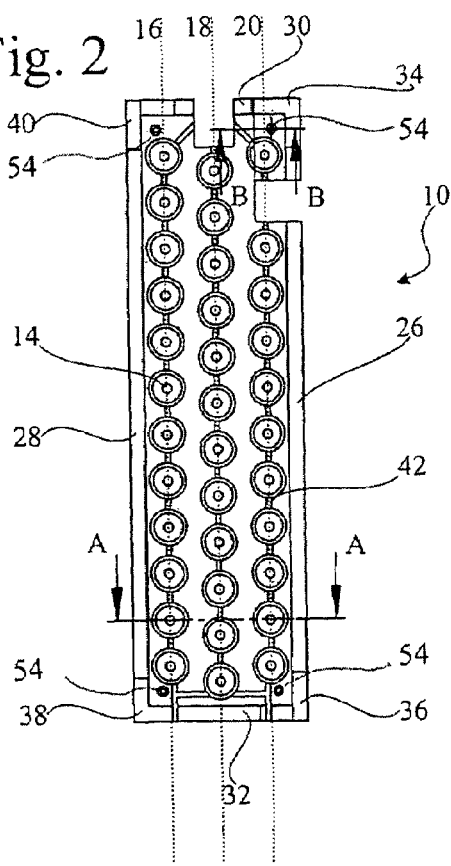
FIG. 2 A plan view of the surface spring of FIG. 1.

FIG. 2 is a plan view of holder 10 with parallel projection rows 16, 18, 20. Walls 26, 28, 30, 32 are provided in the side areas of holder 10. The length of the walls along the sides is shorter than the sides to which the walls are fitted. As a result the corners 34, 36, 38, 40 have no walls. This is the situation so that the corners of a component support to be introduced into the holder 10 are not damaged during introduction and the pins 54 can also be easily reached with the hand. In addition, this significantly facilitates the introduction of the component support into holder 10.

The individual projections 14 are interconnected by grooves 42. As a result of the grooves 42 one of the cup-shaped projections 14 cannot be firmly sucked onto a component support introduced into the holder 10.

Figure 3:
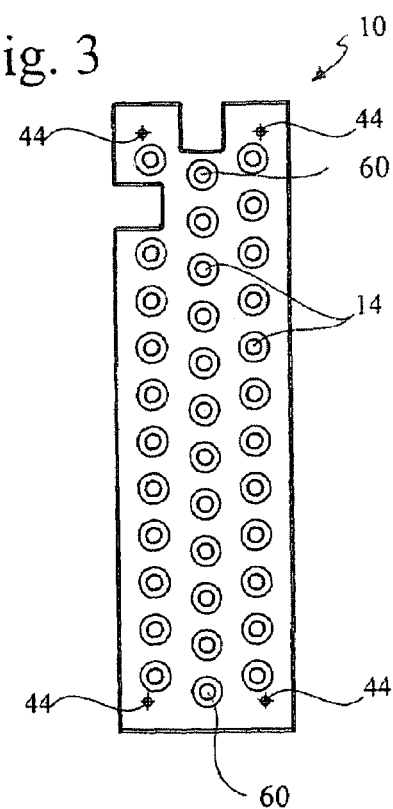
FIG. 3 A view from below of the inventive surface spring of FIG. 1.

FIG. 3 shows that the projections 14 of adjacent rows are mutually displaced leading to a very uniform distribution of the contact pressure. Reference will be made to the function in connection with FIG. 4. The underside 12 of holder 10 shown in FIG. 3 is provided in the corner areas with blind holes 44 shown in greater detail in FIG. 5.

Figure 4:
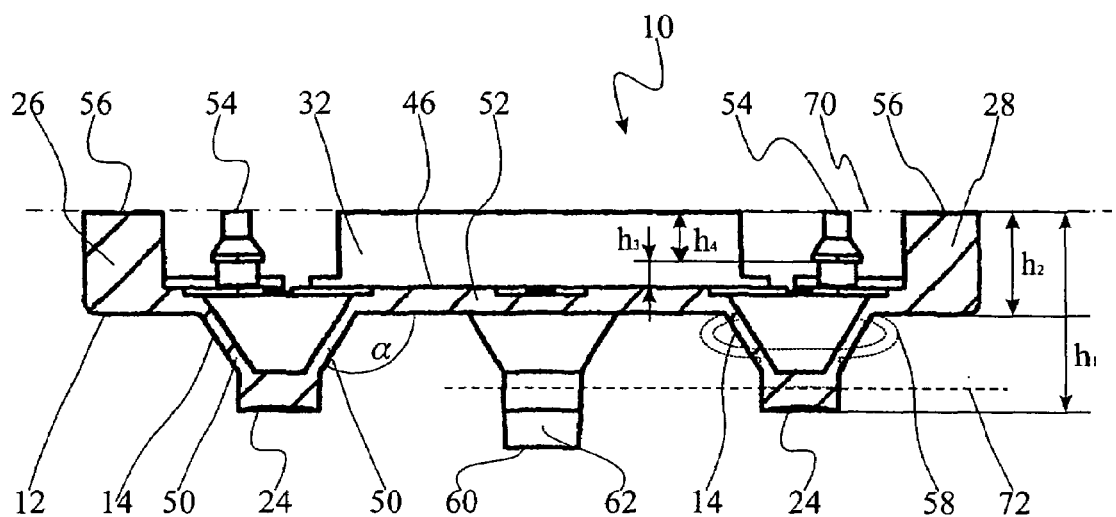
FIG. 4 A sectional view of the surface spring along line A-A in FIG. 2.

FIG. 4 shows a sectional view of holder 10 along line A-A in FIG. 2. The projections 14, which are constructed as hollow bodies, have a largely truncated cone-shaped and cup-shaped configuration. The projections 14 are integral with the holder 10, but form openings in the inside 46. On the front sides 24 they have cylindrical end regions passing into sloping flanks 50, which in turn pass into the bottom 52 of holder 10. The angle formed by bottom 52 and flanks 50 can be in a range 0 to 180ø, preferably 90 to 160ø. In the preferred embodiment it is 135ø.

In the inner area formed by walls 26, 28, 30, 32 pins 54 are provided. As can be gathered from FIG. 5, they are congruent with the holes 44 and are used for fixing a component support introduced into holder 10.

When the holder 10 is installed a component support is introduced into its inner area. The upper edges 56 of walls 26, 28, 30, 32 engage on a dot-dash line cover 70, preferably a glass ceramic hob. Simultaneously the front sides 24 of projections 14 engage on a broken line substructure 72. The distance between the substructure and the glass ceramic hob is smaller than the height h1 and greater than the height h2. As a result the flanks 50 of projections 14 are deformed, namely pressed outwards. The deformed flanks 58 are shown in broken line form. As a result of the springy characteristics of the material used, this deformation brings about a contact pressure, at least on the upper edges 56 of walls 26, 28, 30, 32. If the not shown component support has the maximum height h3 and the components fitted to the component support at least the height h4, the contact pressure brought about by the deformations of projections 14 also acts on the top sides of the components. This is particularly relevant if the components form part of a contact switch which is intended to engage flat on the underside of the cover. To prevent slipping of the holder 10 in the installed state, in the manner shown in FIG. 1 at least two projections 60 have an extension 62 of the cylindrical section which can be fitted in corresponding recesses in the substructure.

Figure 5:
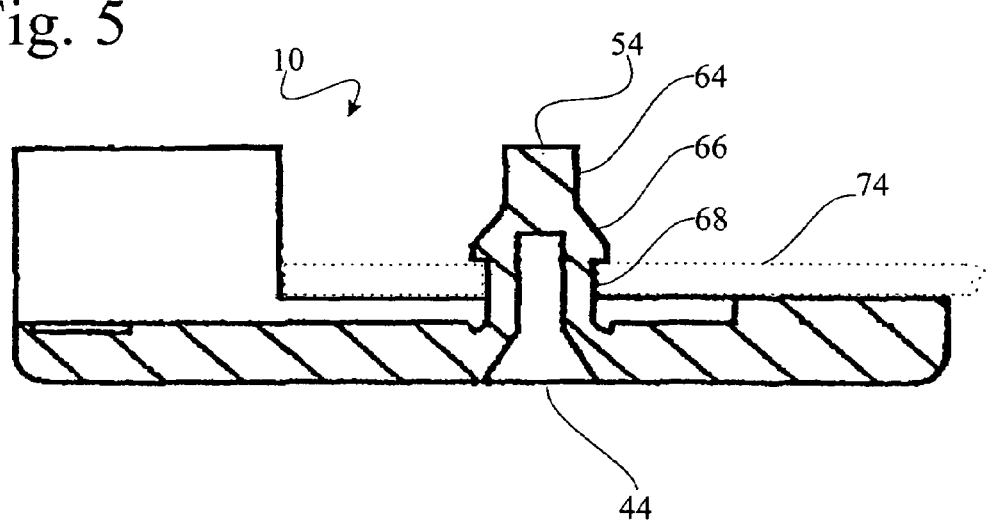
FIG. 5 A sectional view of the surface spring along B-B in FIG. 2.

As can be gathered from FIG. 5 the pin 54 has at least one upper cylindrical section 64 with a first diameter, a truncated cone-shaped section 66 and a second cylindrical section with a second diameter. The second diameter is significantly larger than the first, but smaller than the maximum extension of the truncated cone 66. The smallest extension of the truncated cone 66 passes without transition into cylinder 64 and said truncated cone 66 forms a detent. The pin is integral and is consequently constructed from the same springy material as the holder 10. The transition between pin 54 and bottom 52 is in the vicinity of the cylinder with the second diameter. Concentric to the cylinders a recess 44 is introduced through the bottom, the cylinder with the second diameter and parts of the truncated cone.

The pin 54 is intended to prevent the dropping out of the component support 74 shown in dotted line form. For this purpose the openings provided in component support 74 are guided over pin 54 until the component support is in a position in the vicinity of cylinder 68. The detent formed by truncated cone 66 forms a primary fixing of the component support. As a result of the springy characteristics of the material from which the holder 10 is made and the hole 44 made in the pin said locking connection is reversible. Into the hole 44 can be introduced an assembly stud which elastically tapers the pin when the surface 46 is held down by a component support 74. The pin 54 can then be easily inserted in the opening of component support 74. On retracting the assembly stud the pin 54 locks in the component support 74. If necessary, the fixing of the component support can be additionally secured using a not shown screw or a bolt, which preferably has a countersunk head and is introduced into the hole 44.

Thus, the invention can create a holder for the fixing of at least one areal component support 74, particularly for fixing printed circuit boards for a contact switch unit of a glass ceramic hob, between a cover 70 and a substructure 72 receiving the component support 74. The holder 10 has a plurality of elastic projections, which are distributed integrally and in areal manner on one side of the holder 10 and which form a surface spring. The holder 10 can embrace or frame the component support 74 and therefore receive the same.

The invention claimed is:

1. A holder for fixing at least one component support between a cover and a substructure receiving the component support comprising:
    a plurality of elastic projections distributed integrally and in an area on one side of said holder,
    wherein said projections form a surface spring over said area,
    wherein said projections are hollow cup-shaped bodies having a free front end that can be applied to said substructure.

2. The holder according to claim 1, wherein said projections are integral parts of said holder.

3. The holder according to claim 1, wherein said holder is suitable for fixing printed circuit boards for a contact switch unit of a glass ceramic hob.

4. The holder according to claim 1, wherein said projections have a limited mutual spacing.

5. The holder according to claim 4, wherein said mutual spacing roughly corresponds to a selected width of one of said projections.

6. The holder according to claim 1, wherein said projections have a truncated cone section and a substantially cylindrical end region on an end of the cone section that has a smaller diameter.

7. The holder according to claim 1, wherein the diameter of the cup-shaped hollow bodies at a connection to said holder is larger than the rest of said bodies.

8. The holder according to claim 6, wherein at least one of said substantially cylindrical end regions of said projections is lengthened for fixing said holder for insertion of said lengthened end region in an opening in a part of said substructure.

9. The holder according to claim 1, wherein said holder has a plate-like main body and an edge at least partly surrounding said main body, wherein said edge projects away from said plate-like main body in an extension direction.

10. The holder according to claim 9, wherein said edge is oriented substantially perpendicular to said base surface of said main body, so that a trough shape is formed by said edge and said base surface for said insertion of a component support to be fixed.

11. The holder according to claim 10, wherein said projections are oriented in a direction which is substantially in opposition to said extension direction of said edge surrounding said main body.

12. The holder according to claim 1, wherein said holder has a plate-like main body.

13. The holder according to claim 1, wherein there is at least one pin with a detent on said holder.

14. The holder according to claim 1, wherein said holder is made from an elastic material.

15. The holder according to claim 14, wherein said material is a silicone elastomer.

16. The holder according to claim 1, wherein said holder has a height up to 50 mm.

17. The holder according to claim 16, wherein the height of the holder is between 6 mm and 18 mm.

* * * * *